US010423730B2

(12) United States Patent
Heirman et al.

(10) Patent No.: US 10,423,730 B2
(45) Date of Patent: Sep. 24, 2019

(54) CONTACT MODELING BETWEEN OBJECTS

(71) Applicants:Gert Heirman, Leuven (BE); Niccolo Cappellini, Prato (IT); Tommaso Tamarozzi, Etterbeek (BE); Alessandro Toso, Kessel-Lo (BE)

(72) Inventors: Gert Heirman, Leuven (BE); Niccolo Cappellini, Prato (IT); Tommaso Tamarozzi, Etterbeek (BE); Alessandro Toso, Kessel-Lo (BE)

(73) Assignee: SIEMENS INDUSTRY SOFTWARE NV, Leuven (BE)

( * ) Notice: Subject to any disclaimer, the term of this patent is extended or adjusted under 35 U.S.C. 154(b) by 754 days.

(21) Appl. No.: 14/724,183

(22) Filed: May 28, 2015

(65) Prior Publication Data
US 2016/0098499 A1 Apr. 7, 2016

Related U.S. Application Data

(60) Provisional application No. 62/085,940, filed on Dec. 1, 2014, provisional application No. 62/058,948, filed on Oct. 2, 2014.

(51) Int. Cl.
*G06F 17/50* (2006.01)
*G06F 17/16* (2006.01)
(52) U.S. Cl.
CPC ......... *G06F 17/5009* (2013.01); *G06F 17/16* (2013.01); *G06F 17/5018* (2013.01)
(58) Field of Classification Search
CPC ... G06F 17/5009; G06F 17/5018; G06F 17/16
See application file for complete search history.

(56) References Cited

U.S. PATENT DOCUMENTS

2011/0106510 A1* 5/2011 Poon ................ G05B 23/0254
703/2
2011/0245012 A1* 10/2011 Biermann ............... F16H 48/10
475/248

OTHER PUBLICATIONS

Andersson, A., Vedmar, L. "A dynamic model to determine vibrations in involute helical gears," Department of Machine Elements, Lund Institute of Technology, Journal of Sound and Vibration vol. 260 (2003) pp. 195-212 (Year: 2003).*

(Continued)

*Primary Examiner* — Rehana Perveen
*Assistant Examiner* — Steven W Crabb
(74) *Attorney, Agent, or Firm* — Lempia Summerfield Katz LLC

(57) ABSTRACT

To deal with lightweight and other gear modification in contact modeling, the compliance of the gear is refined for the simulation. The compliance of the teeth of the gear due to contact is separated into bulk and local contact compliance. The bulk compliance accounts for the web variation and is pre-calculated to reduce processing time during simulation. The local compliance is treated quasi-statically to limit time integration during the simulation. One or more of other possible features are included in the simulation, such as calculating compliance resulting from contact of one gear with multiple objects instead of just one pair of gears, neglecting compliance of a stiff gears, accounting for coupling between successive teeth pairs without bulk compliance calculation in the simulation, accounting for gear blank geometry, accounting for a dynamic response of the gear flexibility by assuming that only a part of the gear bulk compliance responds quasi-statically, and modeling non-wheel like shapes for the gear.

21 Claims, 5 Drawing Sheets

(56) References Cited

OTHER PUBLICATIONS

Arafa, M.H., Megahed, M. M. "Evaluation of spur gear mesh compliance using the finite element method," Proc Instn Mech Engrs vol. 213 part C (1999) pp. 569-579 (Year: 1999).*
Zheng-Xiang Zhang, Zhang-Hua Fong, Yu-Huo Li, Hong-Sheng Fang, "A study of the contact stress analysis of cylindrical gears using the hybrid finite element method." Proc IMechE Part C, J Mechanical Engineering Science 227 pp. 3-18 (2012) (Year: 2012).*
Vinayak, H. et al., "Multi-Body Dynamics and Modal Analysis of Compliant Gear Bodies" Journal of Sound and Vibration vol. 210, pp. 171-214 (Year: 1998).*
Dini, D., and D. A. Hills. "Frictional energy dissipation in a rough Hertzian contact." Journal of Tribology 131.2 (2009): 021401.
Hertz, Heinrich. "Über die Berührung fester elastischer Körper." Jan. 1881: 156-171.
PCT International Search Report and Written Opinion of the International Searching Authority dated Dec. 17, 2015, for corresponding PCT/EP2015/072791.
Shuting, Li. "Gear contact model and loaded tooth contact analysis of a three-dimensional, thin-rimmed gear." Journal of Mechanical Design 124.3 (2002): 511-517.
Toso, A., et al. "A comparison and experimental validation of gear contact models for spur and helical gears." International Gear Conference 2014: Aug. 26-28, 2014, Lyon. Chandos Publishing, 2014. Part I.
Toso, A., et al. "A comparison and experimental validation of gear contact models for spur and helical gears." International Gear Conference 2014: Aug. 26-28, 2014, Lyon. Chandos Publishing, 2014. Part II.
"Proceedings of the ASME 2015 International Design Engineering Technical Conferences & Computers and Information in Engineering Conference," IDETC/CIE 2015.
Akbarzadeh, S., Khonsari, M.; "Performance of Spur Gears Considering Surface Roughness and Shear Thinning Lubricant," vol. 130, pp. 1-8; Apr. 7, 2008.
Cai, Y., Hayashi, T.; "The Linear Approximated Equation of Vibration of a Pair of Spur Gears (Theory and Experiment)," vol. 116, No. 2, pp. 558-564; Jun. 1, 1994.
Cai, Y.; "Simulation on the Rotational Vibration of Helical Gears in Consideration of the Tooth Separation Phenomenon (a New Stiffness Function of Helical Involute Tooth Pair)," vol. 117, No. 3, pp. 460-469; Sep. 1, 1995.

E.A.H. Vollebregt, "Improving the Speed and Accuracy of the Frictional Rolling Contact Model "CONTACT"", in B.H.V. Topping, J.M. Adam, F.J. Pallarés, R. Bru, M.L. Romero, (Editors), "Proceedings of the Tenth International Conference on Computational Structures Technology", Civil-Comp Press, Stirlingshire, UK, vol. 17; 2010.
Fonseca, P., Brussel, H., Sas, P.; "The Use of Component Mode Synthesis Techniques in the Design and the Optimisation of Mechatronic Systems," pp. 1-33; Feb. 1998.
Heirman, Gert. "Model Reduction Techniques to Improve the Efficiency of Flexible Multibody Simulations," pp. 1-278; May 2011.
Helsen, Jan, "Global static and dynamic car body stiffness based on a single experimental modal analysis test," Proceedings of the International Conference on Noise and Vibration Engineering—ISMA. vol. 2010, pp. 2505-2522, 2010.
ISO 6336-1:2006(E); "Calculation of load capacity of spur andhelical gears—Part 1: Basic principles, introduction and generalinfluence factors," pp. 1-118; Sep. 2006.
Kolivand, M., and A. Kahraman. "A general approach to locate instantaneous contact lines of gears using surface of roll angle," Journal of mechanical design, vol. 133.1, pp. 1-6; Jan. 2011.
Litvin, F., Fuentes, A.; "Gear Geometry and Applied Theory," Cambridge University Press, Edition 2, pp. 1-818, Sep. 2004.
Maatar, M., and P. Velex. "An analytical expression for the time-varying contact length in perfect cylindrical gears: some possible applications in gear dynamics." Transactions of the ASME-R-Journal of Mechanical Design, vol. 118.4, pp. 586-589; Dec. 1996.
Mul, J., Vree, J., Maas, D.; "Equilibrium and Associated Load Distribution in Ball and Roller Bearings Loaded in Five Degrees of Freedom While Neglecting Friction—Part I: General Theory and Application to Ball Bearings," vol. 111, No. 1, pp. 142-155; Jan. 1, 1989.
Rincon, A., Viadero, F., García, P., Juan, A., Sancibrian, R.; "A Model for the Study of Meshing Stiffness in Spur Gear Transmissions," University of Cantabria, pp. 30-58; Mar. 2013.
Teutsch, Roman, and Bernd Sauer. "An alternative slicing technique to consider pressure concentrations in non-Hertzian line contacts." Journal of tribology, vol. 126.3, pp. 436-442; Jul. 2004.
Weber, C. "The Deformation of Loaded Gears and the Effect on Their Load Carrying Capacity (Part I) DSIR," pp. 1-22; 1949.
Wiegert, Benedikt, Hartmut Hetzler, and Wolfgang Seemann. "A simplified elastohydrodynamic contact model capturing the nonlinear vibration behaviour." Tribology International, vol. 59, pp. 79-89; 2013.

* cited by examiner

CONTACT MODELING BETWEEN OBJECTS

RELATED APPLICATIONS

The present patent document claims the benefit of the filing date under 35 U.S.C. § 119(e) of Provisional U.S. Patent Application Ser. Nos. 62/058,948, filed Oct. 2, 2014, and 62/085,940, filed Dec. 1, 2014, which are hereby incorporated by reference.

BACKGROUND

The present embodiments relate to modeling gear contact. Properly designing a gear box and/or individual gears and optimizing their performance ensures the overall product quality in terms of performance (e.g., dynamics, noise, durability, and/or comfort) and efficiency (e.g., maximize energy yield, and/or minimize friction losses). Virtual design optimization of gears may assist in proper design.

Gears are becoming more flexible, so are prone to operate in less conventional conditions and suffer from durability issues. Lightweight gears are more popular because of the general need of weight reduction caused by stricter regulation on emissions and for higher rotational speed electric motors. Gears are made lighter by reducing the thickness of the gear web (blank) and rim and also by creating holes of different shapes in the web. Besides targeting weight reduction, the lightweight gear blank topology may be used to alter noise, vibration, or harshness (NVH) behavior.

State of the art design tools may not deal with complex industrial lightweight gears in sufficient detail. This limits users to either approximate calculations or to an overly detailed analysis that brings excessive calculation costs and still does not include all relevant physics. The effect of modifications for weight reduction, especially at a system level, is difficult to capture with classical modeling techniques that assume a solid gear blank to model the web stiffness.

BRIEF SUMMARY

By way of introduction, the preferred embodiments described below include methods, systems, instructions, and non-transitory computer readable media for modeling gear contact. To deal with lightweight and other gear modification, the compliance of the gear is refined for the simulation. The compliance of the teeth of the gear due to contact is separated into bulk and local contact compliance. The bulk compliance accounts for, amongst others, the topology of the structure supporting the gear teeth, such as a thin web with holes, and is pre-calculated to reduce processing time during simulation. The local compliance is treated quasi-statically to limit time integration during the simulation. One or more of other possible features are included in the simulation, such as calculating compliance resulting from contact of one gear with multiple objects instead of just one pair of gears, neglecting compliance of a non-light weight gear, accounting for coupling between successive teeth pairs without bulk compliance calculation in the simulation, accounting for gear blank geometry, and modeling non-wheel like shapes for the gear.

In a first aspect, a method is provided for modeling gear contact. Values for bulk compliance of a first gear is calculated prior to a simulation of interaction of the first gear with another object, for a discretization of possible contact loading points. The coupling terms, i.e. the bulk deflection at one possible contact point on the first gear due to a contact load at another possible contact point of the first gear may also be accounted for. In the general (non-linear) case, bulk compliance is a function that maps the contact loads at n possible contact points to the bulk deflection at those n possible contact points. In case the bulk flexibility is linear or may be approximated as such, bulk compliance is a linear mapping and hence a matrix entity. If one chooses to neglect the coupling terms of the bulk compliance, bulk compliance become a function that maps the contact load at a possible contact point to the bulk deflection at this contact points, or, in case the bulk flexibility is linear or may be approximated as such (a diagonal matrix). The simulation of the interaction of the first gear with the other object is performed using the values for the bulk compliance as variables and treating flexibility of the first gear quasi-statically. The simulation accounts for the coupling of a first set of continuously connected teeth of the first gear with the other object in the simulation and for coupling of another portion of the first gear with a different object. The other portion being other than the first set of continuously connected teeth. The simulation is output.

In a second aspect, logic is encoded in one or more non-transitory computer-readable media that includes code for execution. When executed by a processor, the logic is operable to perform operations including: determining a linear contribution of contact compliance between a first gear and a device; and then simulating the contact compliance as a function of the previously determined linear contribution and a non-linear contribution, the non-linear contribution calculated during the simulating, and the simulating of the contact compliance having an instantaneous change in response to a change in an applied contact load. The simulating further comprises one or more of: accounting for coupling of the contact loading on the first gear with both the device and another device in the contact compliance of the first gear; neglecting contact compliance of the device; accounting for coupling of successive teeth pairs as a local contact compliance of the contact compliance separate from the determining of the linear contribution; accounting for coupling of successive teeth pairs with finite element analysis of a blank of the first gear; accounting for the first gear not being axisymmetric; or accounting for the device being a bearing or housing.

In a third aspect, a system is provided for modeling gear contact. A memory is configured to store a pre-calculated deflection as a function of load for a part of a first gear spaced away from a contact surface with a second gear. The first gear is modeled as flexible and the second gear modeled as inflexible. A processor is configured to calculate deflection response of the first gear to the load from the second gear as a function of the pre-calculated deflection and an additional deflection at the contact surface. The additional deflection is calculated as a quasi-static response to a change in the load.

In a fourth aspect, a method is provided for modeling gear contact. A matrix is calculated for residual bulk compliance of a first gear, where the calculating is performed prior to a simulation of contact interaction of the first gear with another object. The simulation of the contact interaction of the first gear with the other object is performed where the simulation uses the matrix for the residual bulk compliance and treats residual flexibility of the first gear quasi-statically. The simulation is output.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Figure 1:
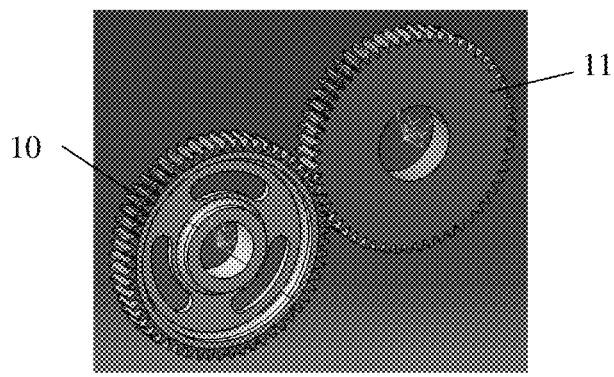
FIG. 1 illustrates one example of a lightweight gear interacting with a solid gear.

Virtual modeling and simulation of industrial lightweight gears is provided. Any lightweight gear may be simulated, such as a solid blank including holes in addition to the hole for an axis. FIG. 1 shows a gear 10 with portions of the blank removed for reducing weight. The blank is also thinned to reduce weight. The gear 11 has a solid blank without thinning and without off-axis holes. Other structures may additionally and/or alternatively be used to lighten the weight of the gear 11 or to deliberately affect the generated gear contact loads and/or the way how these loads are transferred to the shaft (or other component) on which the gear is mounted. Other gears and/or types of components may be included.

To simulate gear contact of a lightweight or other gear, a processor computes the gear tooth and blank flexibility and effect on the meshing behavior in a full transmission. A mix of finite element and multibody modeling techniques are combined to compute the simulation. Near the contact area, the deformation pattern (local contact compliance) exhibits strong gradients, for which finite element modeling may not be suited, but which may be accurately approximated by a local analytical solution. The local contact compliance is evaluated at run-time in a multibody environment that makes use of the pre-computed gear bulk compliance. Further away from the contact area, gear compliance (bulk compliance) is extracted in a pre-processing run from automated finite element analyses. The pre-computation is able to cope with complex geometry associated with lightweight gears outside of the runtime simulation. The deformation further away from the contact area may be considered to be independent on how the gear contact load onto a discretized patch of contact area is spread over this discretized patch of contact area. The deformation only depends on the equivalent force and moment loading onto this discretized patch of contact area. In case material non-linearities and geometric non-linearities due to large amplitude deformation may be neglected, the bulk compliance may be considered to be linear with respect to the applied load. However, the local contact compliance is intrinsically non-linear due to the increase of the contact area as load increases. This best-of both worlds approach thus decomposes the gear meshing compliance in a linear contribution due to the linear elastic behavior of the flexible gear and the non-linear contribution of the local contact stiffness. This separation into pre-computed bulk compliance and run-time local contact compliance is independent from the gear topology and accounts for the flexibility of the gear for system level analysis.

The linear contribution of compliance is bulk compliance. The bulk deflection is a part of the deflection which may reasonably be approximated to be independent on how the gear contact load onto a discretized patch of contact area is spread over this discretized patch of contact area, but only dependent on an equivalent load (i.e., a load that is statically equivalent to the load onto this discretized patch of contact area). The bulk deflection only depends on the equivalent force and moment loading onto this discretized patch of contact area. In one embodiment, the bulk deflection further corresponds to the deflection of a zone beneath the component surface on which the contact load is applied. Deflection is motion due to deformation. Zone is a subvolume, a surface, an area, a line, a curve, or a point depending on the model fidelity and is spaced by some distance from the contact location. The zone is any distance from the contact surface. The bulk compliance refers to the amount of bulk deflection as a function of applied load.

The non-linear contribution is the local contact compliance. The local contact deflection is the other part of the deflection (i.e. complementary to the part identified as bulk deflection) that may not reasonably be approximated to be independent on how the gear contact load onto a discretized patch of contact area is spread over this discretized patch of contact area. In one embodiment, the local contract compliance further corresponds to the relative deflection between, on one hand, the component surface on which the contact load is applied or a lower-dimensional abstraction thereof, and, on the other hand, the chosen zone beneath the component surface on which the contact load is applied. The local contact compliance refers to the amount of local contact deflection as a function of applied load.

In one embodiment, bulk compliance is explicitly calculated in pre-processing. During simulation, the component flexibility is handled quasi-statically. Some or all time integration of the component compliance may be avoided by handling the component flexibility quasi-statically, or a part of the component flexibility. In the system level gear dynamics simulation of many local contacts, the bulk compliance values are used. As the bulk compliance is linear and does not depend on local contact loads, it brings an advantage to calculate the bulk compliance upfront in a preprocessing step and to not repeat this calculation during the simulation. Having bulk compliance directly available from the preprocessing step offers an advantage in CPU time as compared with having to still compute the bulk compliance value in the calculation loop of the simulation. If bulk compliance is not computed explicitly but available indirectly (and possibly approximately) by, for example, a modal representation of the gear flexibility, linear matrix problems would be solved at every iteration step, amongst others, to extract the bulk compliance only for those discretized patches of contact surface that are potentially in contact. For a modal calculation, the matrix sizes are typically moderate, but still add some computational load. If the compliance is not separated, a full finite element calculation is much more time consuming.

The pre-processing of bulk compliance and handling of the compliance quasi-statically is combined with one or more other elements. Various other features may be considered in the simulation. Effects of lubrication and/or successive gear contacts may be included for higher accuracy simulation. Effects of coupling with more than one other object, non-axisymmetric gears, and/or dynamic behavior may be included. Even with added considerations, a time-domain process based on multi-body simulations is provided at affordable computational costs.

The simulation includes accounting for coupling of the gear with multiple devices in the contact compliance of the gear. For example, the housing, bearing and/or bearing rolling element contacts are accounted for in determining the compliance of a given gear. Bearings and/or bearings in combination with gears are accounted for in the simulation. The coupling between all possibly loaded contact zones onto the loaded component are addressed. For example, the compliance of a sun gear is calculated by accounting for contact with multiple planet gears. In yet another example, coupling between contact loading on gear teeth and bearing raceways (e.g. if bearing raceways are integrated into a gear component) are accounted for in the simulation.

Another element is neglecting contact compliance for one or more devices of the simulation. A simple two gear example is shown in FIG. 1. The lightweight gear 10 may deflect more than the solid gear 11, especially where the solid gear is of a less flexible material. The compliance of the more solid, stiffer material, and/or less flexible gear 11 may be neglected or not calculated in the simulation.

Another element is accounting for coupling of successive teeth pairs. For coupling between successive teeth pairs, the coupling of deformation between neighboring teeth is taken into account. The coupling is accounted for with, in part, analytic calculations of the bulk compliance rather than extracting is from finite element analysis. The local contact compliance is treated quasi-statically. The analysis of the flexing of the blank of the lightweight gear through bulk compliance may use finite element analysis. Coupling between successive teeth pairs relies on finite element analysis for the purpose of taking into account non-trivial geometry of the gear blank (i.e. the inner geometry, such as web thickness, web asymmetry, and/or holes in the web).

In yet another element, the simulation accounts for the gear being not axisymmetric. The contact dynamics of gears with a non-wheel-like shape are accounted for in the simulation. For example, a ring wheel of a planetary gear system connects to the housing, making the ring wheel asymmetric for compliance. As another example, the gear is formed from two disks, one smaller than the other but each having teeth for contact with different gears. In yet another example, the gear and/or teeth extend less than 360 degrees (e.g., the gear is a ¼ of a circle shape), such as associated with a weaving machine.

Figure 2:
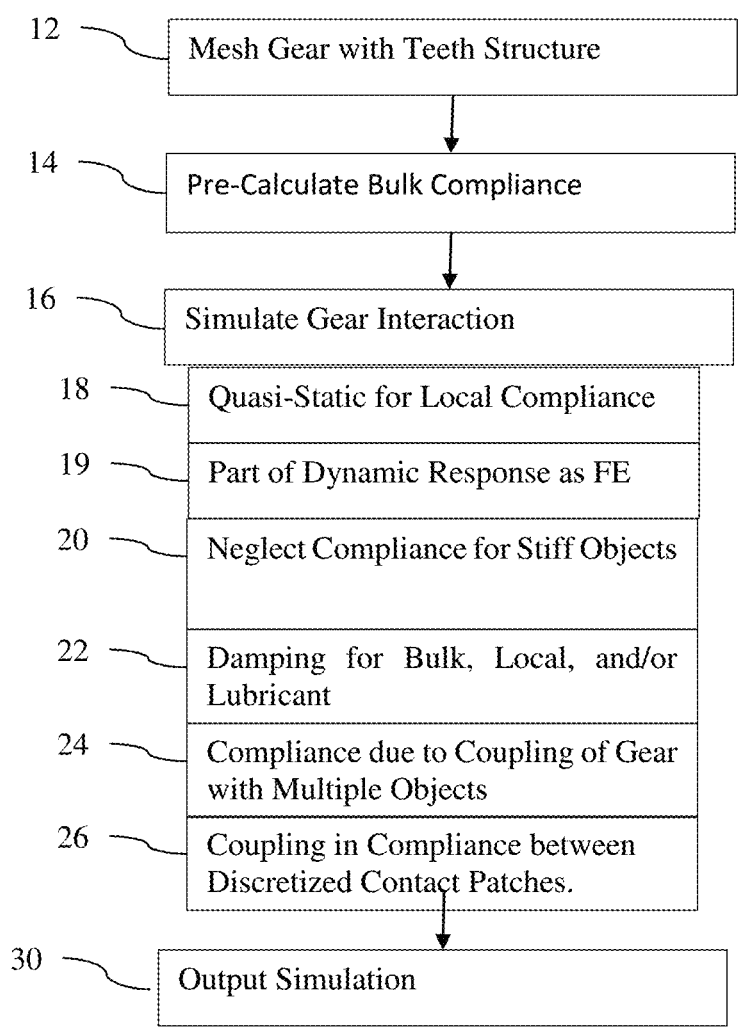
FIG. 2 is a flow chart diagram of one embodiment of a method for modeling gear contact.

FIG. 2 is a flow chart diagram of one embodiment of a method for gear contact modeling. The method simulates the interaction of a gear with one or more other objects, such as a housing, bearing, bearing rolling elements, and/or other gears. The method is implemented by a computer, such as the system of FIG. 8 or other system. A user may input information for the simulation, such as a computer assisted design (CAD) of the gear and/or objects. Other inputs from memory and/or a user interface may be provided, such as for selecting properties of the gear or objects, time increment, or other simulation settings.

The method is performed in the order shown or other orders. Acts 18-26 may be performed in any order, such as shown or a different order. Additional, different, or fewer acts may be provided. For example, acts 19-26 show various elements that may or may not be included in the simulation. Additional elements may be included. As another example, the meshing act 12 is not performed where the design to be simulated is already represented as a mesh. In yet another example, the simulation is stored or not output in act 30.

The method may be performed for any type of gear. For example, the gear is a lightweight gear with one or more holes other than an axial hole and/or a thinning of the blank as compared to the teeth width. Solid or non-lightweight gears may be simulated. The gear may be a spur cylindrical gear, helical cylindrical gear, bevel gear, hypoid gear, beveloid gear, worm gear, other type of gear, or combinations thereof. The simulation is for interaction among two or more objects, such as the gear and a bearing, a bearing rolling element, and/or housing. The bearings may be ball, roller, or other type of bearing. The bearing rolling elements may be balls, rollers or other types of rolling element. Any arrangement of objects including the gear may be simulated, such as simulating a gear box, transmission, or other gears of a vehicle drive train or transmission for another mechanical device.

In act 12, a mesh is defined for simulation for each object. In the example below, the mesh of the gear is described. The same or different meshing is used for other objects.

Automated mesh programs may be used. A regularly distributed collection of nodes is assigned to the gear. A CAD program may mesh the designed gear. Since there are many teeth on a gear and many calculations in the simulation rely on normal or tangent directions, or other geometrical relationships of the surface of the gear at a given node, the complication in calculations for the nodes of the mesh may be reduced by meshing the teeth in a structured way or with a repeating pattern.

Figure 3:
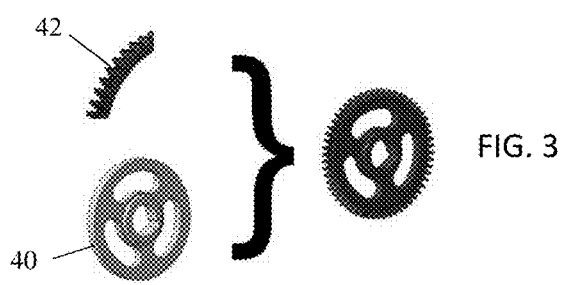
FIG. 3 illustrates separation of the gear teeth from the gear blank for meshing according to one embodiment.

The lightweight gear (e.g., solids with holes) is modeled by combining a CAD-to-finite element translation or conversion for the inner part of the gear (gear body, web, or blank) with a finite element model for the gear teeth in an integrated way represented in FIG. 3. For example, CAD meshing is used for the gear inner part or blank 40 (see FIG. 3). The blank 40 does not include the teeth of the gear. The crown 42 includes the teeth. Rather than using a general purpose mesher for the gear crown 42 (see FIG. 3), a more structured or controlled meshing is used.

In a two-step approach, a processor automatically generates a first mesh for the continuously connected teeth of the first gear. The gear crown 42 or teeth are identified and meshed separately from the blank 40. The CAD of the gear is separated into the blank 40 and crown 42. The processor automatically generates a different mesh for the blank 40. The meshes are different in density of nodes, origin of the mesh, being symmetrical or asymmetrical, being iso or anisotropic, or other characteristics.

The finite element mesh of the gear crown 42 is structured at the interface with the gear blank 40. This allows to imposition of constraints on the CAD meshing process to generate a mesh of the blank 40, so that the finite element meshes of gear blank 42 and gear crown 40 have coinciding nodes at the surface they share. Meshing capabilities are used to merge coincident nodes so that a continuous finite element mesh of the entire gear is generated with a structured mesh at the surface on which contact may occur during simulation.

For the gear crown 42, the mesh is structured to provide the same node arrangement for each tooth of the continuously connected teeth. The nodes for each tooth are identical to the other teeth so that a normal, tangent, or other geometrical calculation for one node of one tooth applies to the same node on each of other teeth. The gear crown 42 may be difficult for an automated CAD mesher to handle with high accuracy, so providing a structured mesher specifically for the crown 42 may assist in automating calculations. Rather than using an automated mesher from CAD, a finite element model may be used or directly created.

The gear blank 40 may include holes, thickness variation, other geometrical differences from a solid gear, or combinations thereof. An automated CAD mesher may handle meshing the geometry of the blank 40 from the CAD file. The CAD file or model may likewise include other objects, such as a housing to which a ring gear is bolted or fixed. The automated mesher from CAD overlays a mesh for the blank 40 and other objects in the simulation. The generated mesh includes the housing and everything bolted or rigidly attached to the blank 40.

Figure 4:
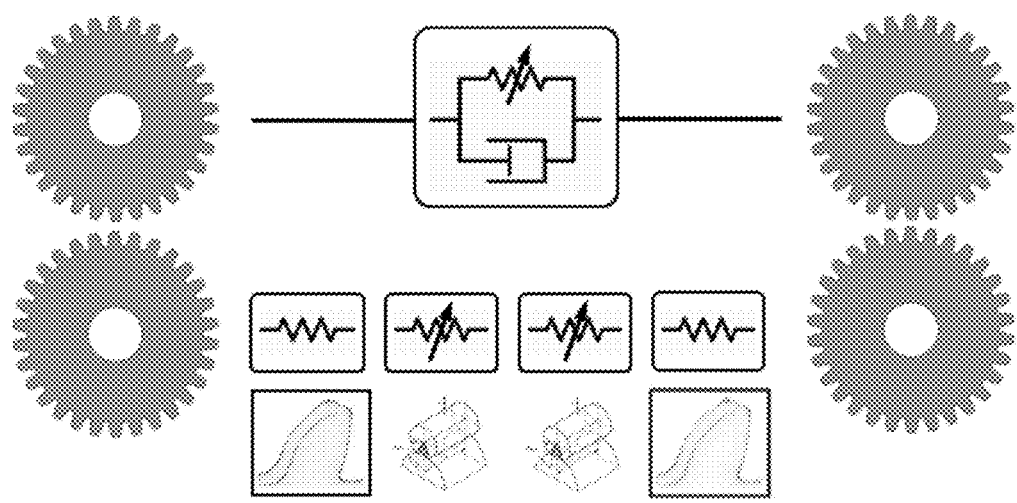
FIG. 4 represents decomposition of compliance resulting from interaction of the teeth into bulk and local contact compliance components.

The processor-created meshes for the various components are used for simulating interaction. The gear inertia is considered to be lumped and the instantaneous gear pair meshing stiffness is computed taking into account the geometrical and material properties of the gears. When two gears contact, several tooth pairs may be in contact at the same time. The different tooth pairs may be considered as (non-linear) springs in parallel. FIG. 4 represents this characterization of gear contact. The total gear force is the sum of the force of the contacting tooth pairs. By exploiting the intrinsic properties of involute gear blanks, contact detection and computation of penetration may be performed efficiently, while accounting for micro-geometry modifications, and translational and rotational misalignment.

The overall contact compliance is inherently non-linear with respect to load because the contact area increases as the load increases, such that the deformation pattern close to the contact will change. In a linear system, deformation patterns remain the same, but their amplitudes scale with applied load. However, the principle of Saint-Venant states that 'the difference between the effects of two different but statically equivalent loads becomes very small at sufficiently large distances from the load.' Applied to contact modeling, far enough away from the contact area, the obtained deformation pattern is the same as the one obtained if the load were a statically equivalent load. In a different embodiment, the load may either considered to be a point load or a line load (e.g. a constant line load over a discretized stretch of contact line) of a load distribution onto a discretized patch of surface (e.g. a constant stress onto a discretized patch of surface). The deformation pattern far away from the contact is independent of the area over which the contact force is spread out and will hence behave linearly with respect to the applied load.

Tooth pair compliance is decomposed into two components per tooth, namely a tooth bulk compliance, which describes the compliance contribution due this far-field deformation, and a local contact compliance, which describes the contribution due to the deformation close to or at the contact area, and which is hence non-linear with respect to the applied load. This approach thus has the advantage of intrinsically capturing the load-dependency of the stiffness (and therefore of the transmission error) that is not observed when using semi-empirical approaches.

Gear contact is modeled by calculating the compliance acting between the components (gears) by decomposing the compliance into its contributions. This separation of compliance is performed for the various objects, such as for each of two mated gears. For example referring to FIG. 1, a bulk compliance is calculated for the gear 10, a local contact compliance depending on the properties of both gears 10, 11 is calculated as a non-linear contact compliance, and a bulk compliance is calculated for gear 11.

The adopted approach is more physics-based as compared to traditional semi-empirical formulas. Furthermore, this approach is modular. The local contact stiffness is assumed to be dry contact (i.e., there are no effects of a lubricant). A local contact compliance model accounting for elasto-hydrodynamic effects may be added as a module. Other elements that may be added are described below with respect to acts 18-26 of FIG. 2.

In FIG. 2, a processor calculates a value or values for the bulk compliance of the gear in act 14. The bulk compliance is a linear term, so may be calculated as a pre-curser to simulating the interaction of the gear with another object or objects. The calculation of the bulk compliance results in an explicit representation of the bulk compliance and the coupling between all possible contact points, so does not need to be repeated during the simulation. If it were not available in a direct way, the bulk compliance may have to be computed only for those discretized stretches of contact area and the couplings between them, at every iteration step during simulation.

In one embodiment, the bulk compliance of a gear or another object may be computed (possibly in an approximate way) by using analytical formula or closed solutions, rather than finite element analysis. Such analytical solutions may also account for coupling, such as inter-tooth coupling.

The bulk compliance is calculated for different load locations. A function (e.g., fit curve) or table describing the resulting bulk compliance is calculated before looping through dynamic interaction of the gear and any objects. The function or table is stored. The values provided by the function or table are recalled during simulation. For example, looking up a value for the bulk compliance given a load or location on the gear may be more efficiently handled by a computer than calculating the bulk compliance as needed during the simulation. Similarly, interpolating from the sparsely represented load locations in the pre-calculation may be more efficient than calculating the bulk compliance without the pre-calculation.

The bulk compliance may be extracted from finite element computations, but other modeling may be used. The bulk compliance describes the coupling between teeth of a lightweight or other gear by a finite element model or results extracted from finite element computations. The effects of the mesh or web thickness, asymmetry, and/or holes are accounted for in the finite element modeling for bulk compliance. The amount of deflection of the gear, that can be approximated to be independent of how the gear contact load is spread out over the discretized patch of contach area, is the bulk deflection. The amount of applied load required to create a certain load deflection is used to determine the bulk compliance. The geometrical structure and material used for the gear, such as holes, thinness, and/or material for a lightweight gear, result in a different compliance than for a solid gear.

The bulk deformation of each tooth (i.e., the far-field deformation or deformation spaced from the contact surface)

is a non-trivial combination of bending, shearing and twisting. Even at high loading conditions, it is reasonable to assume that the deformation is small and that materials typically used for gears behave linearly. The same load applied at different locations along the tooth blank and profile generate a different deformation of the tooth.

Figure 5:
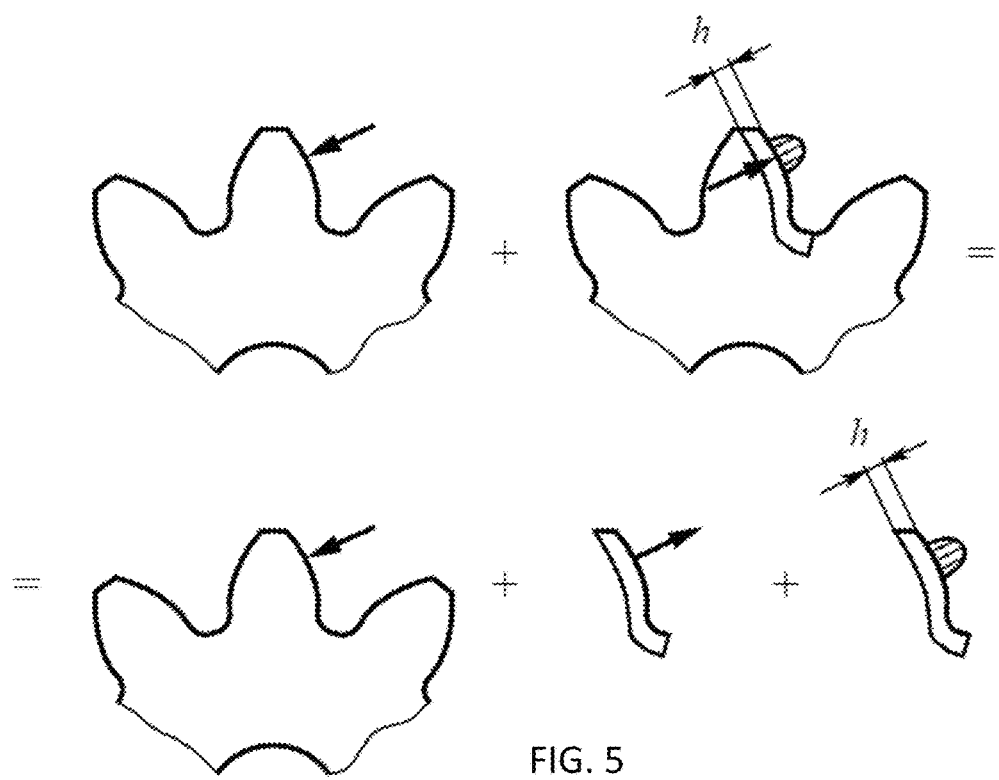
FIG. 5 shows an example representation of local contact and bulk compliance for gear contact modeling.

The tooth bulk stiffness may be computed in two steps. In the first step, a single uniform line load is applied at a given contact line on the tooth blank. When the resulting deformation pattern is computed using finite element analysis, the deformation contains both the (far-field) bulk deformation as well as the deformation close to the contact area. The deformation close to the contact area resembles the true deformation pattern that would occur due to contact loads because a concentrated load was applied instead of a spread-out contact pressure. However, even if the correct contact pressure distribution is applied to the finite element model, the coarseness of the finite element mesh may not allow capturing the strong gradients in the deformation pattern close to the applied load. To obtain only the contribution due to the bulk deformation, the contribution of the deformation close to the contact area is filtered out in the second step. A local boundary condition is added in the tooth interior. At a layer at a pre-set depth h (e.g., 0.25 cm) within the tooth, the nodes are clamped as shown in FIG. 5. The deformation pattern of this second load case will not contain any contribution of the tooth bulk compliance, as the additional boundary condition does not allow for it. Hence, the deformation pattern only includes the approximation of the deformation close to the contact area. The deformation pattern due to only tooth bulk compliance, is then obtained by subtracting the deformation pattern of the second load case from the deformation pattern of the first load case, as shown in FIG. 5. In FIG. 5, the single arrow on the left represents the bulk compliance or force with an assumed point or linear contact. The elliptical curve on the tooth representation to the right represents the typical contact load pressure distribution. The spreading of contact load changes with applied load, causing a non-linear progression of the local contact compliance.

Figure 6:
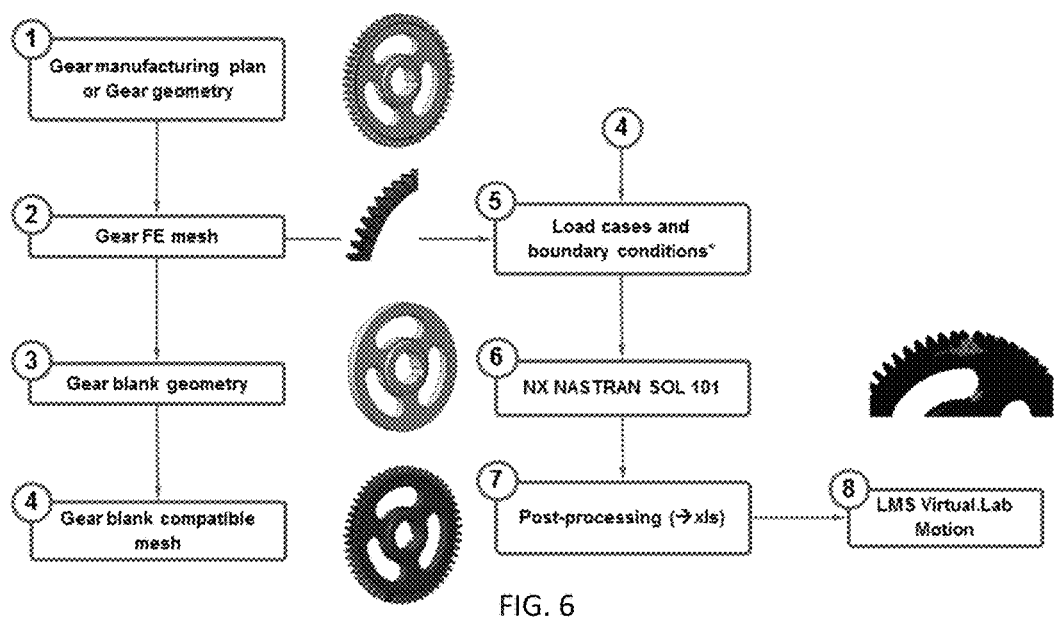
FIG. 6 illustrates one embodiment of a process flow from geometry to multi-body computation in gear modeling.

The bulk compliance is pre-calculated for a set of possible contact locations as different bulk compliance results from different contact locations. FIG. 6 shows a workflow for the calculation of the bulk compliance. The knowledge of the gear geometry or the manufacturing process is provided. At stage 1, the manufacturing process is simulated, so that the gear blank and fillet geometry is obtained, such as from a CAD file. Single-step and/or multi-step manufacturing techniques are supported. An example multi-step manufacturing captured in the knowledge is roughing and finishing operations. For multi-step approaches, the geometric envelope resulting from the consecutive operations is retained as a final geometry. Both cutting tools with and without protuberance are supported, both symmetric as well as asymmetric. Furthermore, the developed simulation may account for undercutting.

In stage 2 of FIG. 6, the structured finite element mesh of the crown of teeth is generated as discussed for act 12 of FIG. 2. The transition from the crown of teeth to the gear blank interior is done at a user-definable radius. The gear blank interior is obtained by a simple Boolean operation in the CAD software. The obtained gear blank interior of stage 3 of FIG. 6 is then meshed with a general-purpose finite element mesher, so the gear blank interior may have any realizable geometry. By imposing any boundary constraints to the general-purpose mesher, a gear blank interior mesh is compatible with the mesh of the crown of teeth. A finite element representation for the total gear is then created by combining both meshes as shown at stage 4 of FIG. 6 and represented in FIG. 3.

The processor automatically creates and runs both load cases of the above-described process in a finite element analysis solver (e.g., NX NASTRAN) for all the possibly loaded contact points in stages 5 and 6 of FIG. 6. The solver output file is then automatically read and stored in a file in stage 7. For simulation, the file from stage 7 with the pre-computed bulk compliance is interpreted by a multibody simulation solver, such as LMS VIRTUAL.LAB MOTION, in stage 8. The file contains information on tooth bulk stiffness as a function of location along the tooth blank, angular position (or tooth number), and tooth flank identifier (left or right tooth flank). During time integration of the simulation, the multi-body solver interpolates the required tooth bulk compliance from this pre-computed data.

The pre-processing described above for the bulk compliance may take approximately 1-2 hours of throughput time for the gear geometry shown in FIG. 6, of which approximately 20 minutes is human effort and the rest is computation time on a personal computer. If the gear blank geometry is symmetrical, the pre-calculation process may take less time. Besides external gears as shown in FIG. 6, the bulk compliance may be calculated for internal gears.

Figure 7:
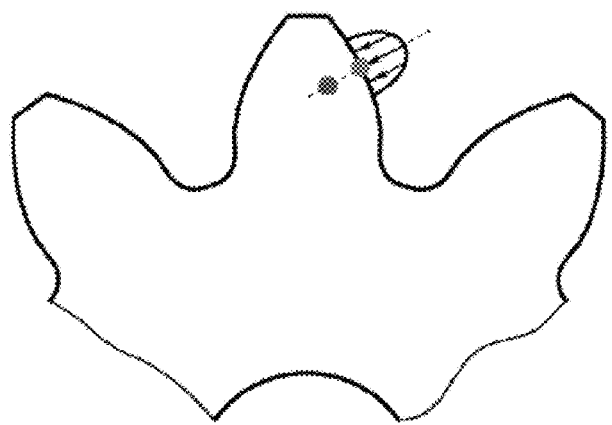
FIG. 7 shows another example representation of local contact and bulk compliance.

FIG. 7 represents the calculation division between local contact and bulk compliance. If the interior point is far enough away from the surface point where the load is applied, the interior point has a deflection similar to the deflection in the case of the statically equivalent load. The actual load distribution (e.g., the shape, contact width, or other characteristics represented in FIG. 7 as a curve centered on the local contact point) depends on the contact conditions. If gears are pressed closer together, the contact load distribution is typically spread out over a larger area. Efficiency gain comes from computing the bulk deflection up-front using the statically equivalent load represented by the arrow in FIG. 5. The computed bulk deflection will be a reasonable approximation for any statically equivalent distributed contact load. In FIG. 7, a two-dimensional cut of part of the gear is shown. In reality, the contact load is spread out in the $3^{rd}$ dimension as well.

Compliance is the amount of deflection as a function of applied load. The stiffness is the amount of load required to obtain a certain deflection. Stiffness is the opposite of compliance, so stiffness may be used instead of compliance. Deflection is the movement of the material points with respect to their position in the undeformed or at rest case. Deflection may refer to the deflection of a single point, or the deflection patterns of certain subset of material points (e.g. all mesh node points on the component). Applied load refers to any type of loading pattern, any volumetric, surface distribution, line distribution, any point load, or any combination thereof. The bulk compliance may not be load dependent, while the local compliance is load dependent.

The bulk deflection of a discretized contact patch at one contact zone is extracted due to loading onto a discretized contact patch of another contact zone. In one implementation, this coupling is represented by the compliance matrix M. Besides coupling through the bulk compliance matrix of one or both components, the local contact compliance may also account for coupling. To account for the coupling between contacts of several components (e.g. a sun gear making contact with several planet gears), the following set of equations represents the underlying mathematical problem of this possible implementation:

$$\vec{w} = \vec{q} + M\vec{F} + \vec{\delta}(\vec{F}) \geq 0, \forall i$$

$$F_i \geq 0, \forall i$$

$$w_i \cdot F_i \geq 0, \forall i$$

where $w_i$ is the gap at discretized patch i in a contact zone (i.e., the inverse of penetration), $\vec{w}$ is the vector combining all $w_i$, $\vec{w} \geq 0$ means that every component of $\vec{w}$ is positive, $F_i$ is the force transmitted at discretized patch i, $\vec{F}$ is a vector combining all $F_i$, $M=M_1+M_2$ is the compliance matrix, which is a sum of the bulk compliance matrices of both (possibly) contacting components, $M_1$ is the bulk compliance matrix of component 1 (e.g., lightweight gear 10), and $M_2$ is the bulk compliance matrix of component 2 (e.g., solid gear 12), and where $\delta$ is the local contact deflection. The element (i,j) of compliance matrix $M_k$ refers to the amount of bulk deflection of component k at a discretized patch of contact area i due to the contact load at a discretized patch of contact area j, where the deflection is defined to be positive if the deflection causes the contacting objects to move away from each other.

For multiple contacts, the set of all discretized contact patches may refer to all discretized contact patches in different contact zones onto a single component. There may be several contact zones on a single component because 1) more than one component is making contact with a single gear geometry, such as a sun gear in contact with several planet gears or a bearing raceway making contact with several rolling elements, or because 2) a single component has several geometries on with which contact is made, such as a component having several gear geometries and/or bearing raceway geometries, or because 3) a combination of (1) and (2). Due to contacts of the sun gear with any of the planet gears in the case of one example, the set may refer to all discretized contact patches in different contact zones onto several components (e.g., in case of a planetary transmission, the sun gear makes contact with (possibly) several planet gears). The planet gears make contact with the ring gear. There is no contact between sun gear and ring gear. For an example of a planetary gear stage with two planet gears:

$$\vec{w} = \begin{bmatrix} \vec{w_1} \\ \vec{w_2} \\ \vec{w_3} \\ \vec{w_4} \end{bmatrix}$$

In which: $\vec{w_1}$ is the resulting gap at all discretized contact patches in all contact zones corresponding to contact between the sun gear and planet gear 1, $\vec{w_2}$ is the resulting gap at all discretized contact patches in all contact zones corresponding to contact between the sun gear and planet gear 2, $\vec{w_3}$ is the resulting gap at all discretized contact patches in all contact zones corresponding to contact between planet gear 1 and the ring gear, and $\vec{w_4}$ is the resulting gap at all discretized contact patches in all contact zones corresponding to contact between the planet gear 2 and the ring gear.

The contacts between any pair of components may be uniquely defined by an index. The corresponding overall bulk compliance matrix is:

In which, $M_{11,sun}$ is the bulk compliance matrix corresponding to the bulk compliance of the sun at all discretized contact patches in all contact zones corresponding to contact between the sun gear and planet gear 1, $M_{21,sun}$ is the bulk compliance matrix corresponding to the bulk deflection of the sun at all discretized contact patches in all contact zones corresponding to contact between the sun gear and planet gear 1, due to loading in all contact zones corresponding to contact between the sun gear and planet gear 2. In general, $M_{xy,component}$ is the bulk compliance matrix corresponding to the bulk deflection of the 'component' at all discretized contact patches in all contact zones corresponding to contact 'x', due to loading in all contact zones corresponding to contact 'y', where 'x' and 'y' are indices identifying the contact between a pair of components For other gear arrangements or components, similar collections of matrices may be created for the bulk compliance as a function of location. In another embodiment, $M_{xy,component}$ is the residual bulk compliance matrix corresponding to the residual bulk deflection of the 'component' at all discretized contact patches in all contact zones corresponding to contact 'x', due to loading in all contact zones corresponding to contact 'y', where 'x' and 'y' are indices identifying the contact between a pair of components.

The value or values of the bulk compliance for a given gear are pre-calculated based on interaction with one or more (e.g., multiple) other objects. The bulk compliance for each, one, or more gears, describes the coupling between, on one hand, the deflections at potentially all possibly loaded contact zones, and on the other hand, all contact loading onto this component (gear). In one embodiment, the bulk compliance describes the coupling between the deflection of different gear teeth by an analytical formula, possibly avoiding finite element analysis in the simulation. Through the meshing, the bulk compliance for any gear type interacting with any number of other objects may be determined. The bulk compliance accounts for any fixed connection, such as by bolting or welding, to connect two or more components together. The fixedly connected components are treated as a single component.

In one embodiment, the bulk compliance is pre-calculated for various gears in a gear box. A ring gear of the planetary gear stage is attached to other components forming the housing of this gearbox. Planetary gears and other gears are provided in the gear box. The bulk compliance is calculated for any or all of these gears.

The bulk compliance is used in simulation of contact between pairs or multiple objects. The interaction between a gear and bearing, gear and gear, bearing raceway and bearing rolling elements, or combinations thereof is modeled. For example, a gear is loaded at its tooth flanks as well as at the integrated bearing raceways, so the bulk compliance is calculated to account for the various loads. In the simulation, the local contact compliance takes the coupling between all or a sub-set resulting contact zones into account.

In act 16, the simulation of the interaction of the gear with one or more other objects is performed. The processor or computer uses the mesh, pre-calculated bulk compliance, and other information to simulate the gear interaction. The simulation is performed in a loop, such as repeating the calculations to represent the gear contact over time in $$M = \begin{bmatrix} M_{11,sun} + M_{11,planet1} & M_{21,sun} & M_{13,planet1} & 0 \\ M_{12,sun} & M_{22sun} + M_{22,planet2} & 0 & M_{24,planet2} \\ M_{31,planet1} & 0 & M_{33,planet1} + M_{33,ring} & M_{34,ring} \\ 0 & M_{42,planet2} & M_{43,ring} & M_{44,planet2} + M_{44,ring} \end{bmatrix}$$

temporal increments. The simulation accounts for the compliance of the gear, such as a lightweight gear. Any simulation for contact modeling may be used.

In one embodiment, the contact modeling relies on a two-step process to assess contact loads. These two steps include (1) detecting contact and computing amount of required deflection at those contact zones, and (2) translating deflections into contact loads. The bulk compliance may be used in the second step. Additional, different, or fewer steps or other contact modeling may be used. When using the two-step process of contact modeling in time-domain simulation, the two steps are performed at every time step in the case of explicit time integration or at every iteration step within every time step in the case of implicit time integration.

In the first step, the processor detects contact and computes an amount of required deflection at those contact zones. Various implementations are possible depending on how contact zones are discretized. The contact zone may be discretized into contact points. The contact loading at a discretized point may be assumed to be spread out over an ellipse centered at the discretized contact point, such as described by Litvin, et al. in chapter 9.3 of "Gear Geometry And Applied Theory." The contact zone may be discretized into stretches of contact lines. Contact loading is spread out constantly along the stretch of line and elliptically orthogonal to the line, such as disclosed in *DSIR Sponsored Res Report no 3*. The contact zone may be discretized as a rectangular surface patch. The contact pressure may be assumed to contact over this patch, as is described by Vollebregt in "Improving Speed And Accuracy Of Frictional Contact Model. Other approaches to detecting contact may be used.

For each of these patches a gap $q_i$ between the un-deformed geometries of the possibly contacting components is computed. The computed gap may also be negative, indicating a penetration between the un-deformed geometries of the possibly contacting components at the given discretized patch of contact area. The computation of this gap may be specific to the geometry of the given component, such as a gear or bearing, and is computed using any now known or later developed approach. For cylindrical gears with involute gear profiles, Fernandez teaches an example in A Model for the Study of Meshing Stiffness in Spur Gear Transmissions.pdf (2013, chapter 2.2). For bevel and hypoid gears, Kolivand teaches an example in General Approach To Locate Instantaneous Contact Lines Of Gears Using Surface Of Roll Angle. For roller element bearings, de Mul et al. teach an example in Equilibrium and Associated Load Distribution in Ball and Roller Bearings loaded in Five DOF while Neglecting Friction.pdf (1989 in parts I and II).

The computed gap corresponds to the amount of gap for the un-deformed geometries, corrected for the deformation due to the instantaneous response of the dynamically responding deformation patterns, or the deformation patterns that are modeled so that their dynamic response is accounted for. The correction for the deformation due to the instantaneous response of the dynamically responding deformation patterns may be calculated by:

$$q_i = q_{i, undeformed\ geometry} + \sum_j \Psi_{i,j, component\ A} \eta_{j, component\ A} + \sum_j \Psi_{i,j, component\ B} \eta_{j, component\ B}$$

where $q_{i, undeformed\ formed\ geometry}$ is the gap that would exist between the undeformed geometries (e.g. computed as in Fernandez, Kolivand or de Mul), $\Psi_{i,j, component\ A}$ is the additional deflections of contact patch i on component A (e.g. a first gear) due to a unit response of dynamically responding deformation pattern j of component A, $\eta_{j, component\ A}$ is the modal participation factor corresponding to dynamically responding deformation pattern j of component A (positive corresponding to an increase in gap). $\Psi_{i,j, component\ A} \eta_{j, component\ A}$ hence indicates to which extent deformation pattern j of component A contributes to the deflection of the given component at contact patch i. If the model representation of the deformation of the other component, such as component B (e.g. a second gear), also includes modeling the dynamic response of a selected set of deformation patterns, the last term in the above equation is taken into account. The variable definitions are:

$\Psi_{i,j, component\ B}$ is the additional deflections of contact patch i on component B due to a unit response of dynamically responding deformation pattern j of component B, and $\eta_{j, component\ B}$ is the modal participation factor corresponding to dynamically responding deformation pattern j of component B.

The model representation of the deformation of the either of both components may or may not include modeling the dynamic response of a selected set of deformation patterns. If model does not so include dynamic response for component A, the term $\Sigma_j \Psi_{i,j, component\ A} \eta_{j, component\ A}$ is omitted in the above equation. If the model does not so include dynamic response for component B, the term $\Sigma_j \Psi_{i,j, component\ B} \eta_{j, component\ B}$ is omitted in the above equation. In step two, the simulation uses the values for the bulk compliance as variables and treats the compliance quasi-statically. The processor translates deflections into contact loads. The compliance of contacting components is decomposed into bulk compliance and local contact compliance for computation in step two. The penetration (i.e. the opposite of gap) computed in step one is overcome by the combination of the different contributions. The flexibility of the component is treated as responding quasi-statically. The result is a non-linear complementarity problem as discussed above and repeated below:

$$\vec{w} = \vec{q} + M\vec{F} + \vec{\delta}(\vec{F}) \geq 0, \forall i$$

$$F_i \geq 0, \forall i$$

$$w_i \cdot F_i \geq 0, \forall i$$

where $w_i$ is the gap at discretized patch i in a contact zone (i.e., the inverse of penetration), $\vec{w}$ is the vector combining all $w_i$, $\vec{w} \geq 0$ means that every component of $\vec{w}$ is positive, $F_i$ is the force transmitted at discretized patch i, $\vec{F}$ is a vector combining all $F_i$, $M = M_1 + M_2$ is the compliance matrix, which is a sum of the bulk compliance matrices of both (possibly) contacting components, $M_1$ is the bulk compliance matrix of component 1 (e.g., lightweight gear 10), and $M_2$ is the bulk compliance matrix of component 2 (e.g., solid gear 12).

The bulk deflection is treated as linear with respect to the contact loading and may be represented as a multiplication of bulk compliance matrix and contact load. A non-linear relationship between contact load and bulk deflection may be provided.

$\delta(\vec{F})$ is the deflection due to the local contact compliance of both (possibly) contacting components. The contact compliance is simulated using the linear contribution as a pre-calculated value or values and a non-linear contribution calculated in the loop of the two-step process. The non-linear contribution is calculated during the simulation where a specific load and contact are modeled in a time step of the simulation. The processor computes a local contact compliance for one or more contact zones depending on the properties of both components contacting in the respective contact zones. The material and geometric properties determine the contact zone and deflection used for local contact compliance.

Finite element analysis uses the fine finite element meshes to correctly capture the high gradients in the deformation pattern near the contact area. Alternatively, analytical solutions exist that describe the local deformation occurring when two objects are in contact. Such analytical solutions hence describe the mutual approach between two points, each at a pre-set depth beneath the surface in their respective tooth. By accounting for the increase in contact area as contact load increases, this analytical solution accounts for the non-linearity of the local contact compliance with respect to the applied contact load. The formula derived by Weber and Banaschek predicts the mutual approach between two points, each at a pre-set depth beneath the surface in their respective tooth. A Hertzian deformation pattern is assumed near the contact but only the material compression for a finite depth of material is considered. This approach ensures consistency by choosing the same finite depth of material when computing for the bulk compliance as when assessing the local contact compliance.

The local contact deflection for a line load F is $\delta(F)$ and is dependent on the width of the contact patch b, which on its turn is dependent on the load $\delta(F)$, as represented by:

$$\delta(F) = \frac{2(1-v^2)}{\pi E}\frac{F}{w}\left[\ln\left(\frac{h}{b} + \sqrt{1+\left(\frac{h}{b}\right)^2}\right) - \frac{v}{1-v}\left(\frac{h}{b}\right)^2\left(\sqrt{1+\left(\frac{b}{h}\right)^2} - 1\right)\right]$$

$$b = \sqrt{\frac{4F\rho}{\pi E w}}, \rho = \frac{\rho_1\rho_2}{\rho_1+\rho_2}, \frac{2}{E} = \frac{1-v_1^2}{E_1} + \frac{1-v_2^2}{E_2}$$

where h indicates the finite depth, E and v are the Young's modulus and the Poisson's coefficient for the material of the gear, $\rho$ is the local radii of curvature at the contact point, and w is the face width. Other local contact deflection calculations may be used.

In addition to the compliance, the simulation of act 16 includes various other calculations, such as for the force and movements of the various components. Any analytical, modal, finite element, or other representation may be used for the simulation. For example, in multibody simulation, the motion of components is represented by the translational and rotational motion of a reference frame. On top of the motion of this reference frame, additional motion due to deformation is represented as motion relative to this reference frame. In a typical time-domain simulation or static analysis, all forces exerted on these components are computed at certain discretized moments in time for assumed system states. In a typical solution process, the solver iterates on these assumed system states until equilibrium is attained at the given moment in time (e.g., static equilibrium in case of static analysis, or dynamic equilibrium in case of time-domain analysis). The contact loading onto a component is one of the possible loads to be evaluated at such discretized moments in time. The techniques described herein may hence contribute to this part of the overall simulation process. For compliance, the simulation includes one or more other elements or considerations. Acts 18-28 show some example other elements. Additional, different, or fewer other elements for modeling the compliance may be used.

In one embodiment, the state of the complete simulated system, referred to as the system state, is represented by variables representing the rigid body motion of the components, the flexible response of the selected contacting components, and possibly variables representing the flexible response of components other than the contacting components, and possibly variables representing other dynamic processes. The variables corresponding to the rigid body motion are assumed to respond dynamically (e.g., their response is not approximated to be the same as if the instantaneous loads onto the components would be applied statically (e.g., contact in time)). In one embodiment, dynamically responding variables are handled by time integration. The flexibility of the selected contacting components, such as gears, bearing raceways and bearing rolling elements, is assumed to respond quasi-statically (e.g., their response is not approximated to be the same as if the instantaneous loads onto the components would be applied statically (e.g., contact in time)). The flexibility of the contacting components is decomposed into a bulk compliance and a local contact compliance.

The response of a component to applied load may be decomposed into rigid body motion and a flexible response. Rigid body motion of a component does not involve deformation of the component. The flexible response has to be orthogonal to the rigid body motion, whereas orthogonal may be: 1) a sufficient set of points and/or rotations at points is not allowed to move in the flexible response, 2) a sufficient set of weighted averages of points and/or rotations at points remains zero in the flexible response, or 3) the flexible motion is mass-orthogonal to the rigid body motion, (which is a special case of '2)')

In act 18, the simulation of the contact compliance uses a quasi-static approach. The contact compliance is modeled as having an instantaneous change in response to a change in an applied load. The flexibility of at least one of the gears is treated quasi-statically so that flexibility has a response to the applied load. The response only depends on the instantaneous load, and not on the loading history. This response is the same as one would have if the load were to be applied statically (i.e., constant in time).

In one embodiment, the processor distinguishes between high-frequency dynamics and low-frequency dynamics of the flexibility of one or more components. High-frequency dynamics are assumed to respond dynamically, and low-frequency dynamics are assumed to respond quasi-statically. A quasi-static response means that the response is the same (or reasonably similar to) as if the instantaneous loads onto the component would be applied statically (i.e., constant in time). In case of a dynamic response, one cannot reasonably assume that the response is similar to the situation when the instantaneous loads onto the component would be applied statically. In one embodiment, the component response is decomposed into the contributions of Eigen modes. The excitation of this component will have a certain frequency spectrum. In many cases, there is no excitation above a certain threshold frequency, or the excitation above a certain threshold frequency is neglected. In such cases, only those Eigen frequencies with an Eigen frequency below this threshold frequency, or with an Eigen frequency close to the threshold, respond dynamically (i.e., their response will not be the same as if the instantaneous loading would be applied statically). Any threshold may be used, such as an Eigen frequency below 2 or 1.5 times the maximum frequency of the excitation or applied load. In another embodiment, this concept is generalized: a first set of deformation patterns responding dynamically are distinguished from second set of deformation patterns responding quasi-statically. In one embodiment, the set of quasi-statically responding deformation patterns is computed as a residual with respect to the set of dynamically responding deformation patterns, or those deformation patterns that are modeled to respond dynamically (e.g., by handling their modal participation factors through time integration and also accounting for their modal mass and damping). A residual quantity means that the contribution of the subset of deformation patterns of which the dynamics are taken into account is absent in this quantity. In one embodiment, 'making a quantity residual' is orthogonalizing with respect to the dynamically responding deformation pattern or those of which the response is treated to be dynamical (e.g. by mass-orthogonalizing).

All Eigen modes with higher Eigen frequencies, are assumed to respond quasi-statically, such that their response is approximated as the response if the instantaneous loading was applied statically. If the component loading has frequency content which dynamically excites certain Eigen modes, one can no longer reasonably assume that these Eigen modes respond quasi-statically. It is possible to make a quantity residual, meaning that this quantity does not contain the contribution of the dynamically responding Eigen modes. The contributions of the dynamically responding Eigen modes may be subtracted from compliance, resulting in a residual compliance. As a result, the deformed state of the component is described by the contributions of dynamically responding Eigen modes, the residual bulk deflection, and the residual local contact compliance. The dynamically responding Eigen modes are handled by a time integrator in a time-domain simulation. The modal participation factors (i.e., number indicating contribution of a deformation pattern to the components deformation) are governed by differential equations which may be coupled to the other equations governing the overall system response. The residual bulk deflection is the bulk deflection of which the contribution of the dynamically responding Eigen modes (or more general component dynamics) have been removed. The residual local contact compliance is the local contact deflection of which the contribution of the dynamically responding Eigen modes or more general component dynamics have been removed.

It is possible to make a quantity residual, meaning that this quantity does not contain the contribution of the dynamically responding deformation patterns. The contributions of the dynamically responding deformation patterns may be subtracted from compliance, resulting in a residual compliance. As a result, the deformed state of the component is described by the contributions of dynamically responding deformation patterns, the residual bulk deflection, and the residual local contact compliance. The dynamically responding deformation patterns are handled by a time integrator in a time-domain simulation. The modal participation factors (i.e., number indicating contribution of a deformation pattern to the components deformation) are governed by differential equations that may be coupled to the other equations governing the overall system response. The residual bulk deflection is the bulk deflection of which the contribution of the dynamically responding deformation patterns or more general component dynamics have been removed. The residual local contact compliance is the local contact deflection of which the contribution of the dynamically responding deformation patterns have been removed.

In one embodiment, the variable q now is computed using the deformed geometries of the components (in this case gears), which have the same rigid body position. These deformed geometries should only take into account the deformation due to the dynamically responding Eigen modes or the quasi-static response. If the frequency spectrum of the excitation is limited or the frequency components above a certain threshold are negligible, the response of the component is quasi-static. Regardless of being negligible, the quasi-static response may be used without the other Eigen modes. Equation 10 of Nelsen, et al. in "Global static and dynamic car body stiffness based on a single experimental modal analysis test" has an upper residual term that does not depend on the excitation frequency $\omega$. This is the part of the component flexibility dynamics that will respond quasi-statically.

Gert Heirman. Model reduction techniques to improve the efficiency of flexible multibody simulations. PhD thesis. University of Leuven (KU Leuven) equations (3.5) to (3.12) describe how to compute residual deformation patterns and residual inertia-relief deformation patterns, 'inertia-relief' meaning that these deformation patterns are mass-orthogonal with respect to the rigid-body modes. This is a method to distinguish the quasi-statically responding deformation patterns from the dynamically responding deformation patterns. Other methods to compute residual quantities may also be used, such as directly computing residual inertia-relief attachment modes e.g. in a finite element analysis tool like NX Nastran or MSC Nastran.

A set of residual deformation patterns $\Psi_{res} = [\Psi_{1,res} \Psi_{2,res} \ldots \Psi_{n,res}]$ due to a set of loads $F_a = [F_1 F_2 \ldots F_n]$ may be computed as: $\Psi_{res} = G_d F_a$, in which $G_d = G_e - \Phi_d (\Phi_d^T K \Phi_d)^{-1} \Phi_d^T$, in which $G_e$ is the elastic flexibility matrix of the given component, K the stiffness matrix of the given component and $\Phi_d$ the set of deformation patterns that are treated dynamically (e.g., one accounts for their dynamic response). The above computation may be done with finite element analysis. The corresponding residual compliance matrix $M_{component}$ for the given component (identified through the index component) can be computed as $P \Psi_{res}$, where $\Psi_{res}$ is computed as in the method described above, by choosing $F_a$ as a set of vectors for which each vector corresponds to a unit load onto all discretized contact patches, or a subset thereof (e.g., all contact patches that may possibly in contact at a given moment in time), and by choosing P as a Boolean matrix selecting all discretized contact patches, or the before-mentioned subset thereof, and this in the same order related to the discretized contact patches as the order in which the vectors in $F_a$ relate to the discretized contact patches. Other methods to compute residual quantities may also be used. Similarly a non-residual compliance matrix would result from the same computation in case the set $\Phi_d$ is empty.

A set of deformation patterns $\Psi = [\Psi_1 \Psi_2 \ldots \Psi_m]$ may be made residual to a set of deformation patterns $D = [\Phi_1 \Phi_2 \ldots \Phi_n]$ in the following way: 1) if the set of deformation patterns D are not yet mass- and stiffness-orthogonalized with respect to each other, first the deformation patterns $\Phi$ are mass- and stiffness-orthogonalized with respect to each other by solving for all of the eigenvalues and eigenvectors of the eigenvalue problem $(\Phi^T K \Phi - \omega_i^2 \Phi^T M \Phi) \overline{\Phi}_i = 0$, so that a new set of deformation patterns $\overline{\Phi} = [\overline{\Phi}_1 \overline{\Phi}_2 \ldots \overline{\Phi}_n]$ is obtained that spans the same vector space as $\Phi$. 2) Then the set of deformation patterns $\Psi$ is orthonormalized with respect to Φ, resulting in the set of residual deformation patterns $\Psi_{res}=[\Psi_{res,1}\ \Psi_{res,2}\ \ldots\ \Psi_{res,m}]$, by the following formula $$\Psi_{res,i} = \Psi_i - \sum_{j=1}^{n} \frac{(\Psi_i^T A \Phi_j) \Phi_j}{\Phi_j^T A \Phi_j}, \forall\ i = 1, m,$$

in which A is a wieghtings matrix. In one embodiment, the matrix A is chosen to be the stiffness matrix of the given component. In another embodiment, the matrix A is chosen to be the mass matrix of the given component.

In one embodiment, the state of the complete simulated system, referred to as the system state, is represented by variables representing the rigid body motion of the components, variables representing the instantaneous state of those deformation patterns of the selected contacting components that are treated dynamically, the residual flexible response of the selected contacting components (i.e. residual to those deformation patterns of the selected contacting components which are treated dynamically), possibly variables representing the flexible response of components other than the contacting components, and possibly variables representing other dynamic processes. The variables corresponding to the rigid body motion and those deformation patterns of the selected contacting components that are treated dynamically, are assumed to respond dynamically (e.g., their response is not approximated to be the same as if the instantaneous loads onto the components would be applied statically (i.e., contact in time). In one embodiment, dynamically responding variables are handled by time integration. The residual flexibility of the selected contacting components, such as gears, bearing raceways and bearing rolling elements, is assumed to respond quasi-statically (e.g., their response is not approximated to be the same as if the instantaneous loads onto the components would be applied statically (e.g., contact in time). The residual flexibility of the contacting components is decomposed into a residual bulk compliance and a residual local contact compliance. In one embodiment, the residual contact compliance is approximated as the non-residualized counterpart, such as by omitting the step to make the residual contact compliance mass-orthogonal to those deformation patterns of the selected contacting components which are treated dynamically.

In an alternative or further embodiment of act 19, the residual bulk compliance is modeled as well as the dynamic response. For example, the dynamically responding component deformation patterns of the bulk compliance are modeled quasi-statically, avoiding calculations associated with time integration and/or corresponding differential equations. The residual bulk compliance for one or more components onto which contact loads are applied is also modeled, but using time integration and/or corresponding differential equations. The residual compliance is modeled as describing the coupling between all possibly loaded contact zones onto this component. The contact load may be due to contact between any components, such as between gears, bearing surfaces, bearing raceways, or bearing rolling elements. The local contact compliance is also modeled and depends on the properties of both components contacting in the respective contact zones. This local contact compliance may be residual or not.

By accounting for dynamic gear response with a quasi-static component for one sub-set of Eigen modes and with the residual for another sub-set of Eigen modes, the processor may more efficiently calculate dynamic gear response. Using unreduced finite element models including contact formulations without quasi-static assumption results in a processing inefficient brute force model. By incorporating both quasi-static for some Eigen modes and residual with finite element modeling for other Eigen modes, a more accurate dynamic response is provided than with modal descriptions. Part of the dynamics is solved analytically. By separating low frequency dynamics and high frequency dynamics, time integration of the high-frequency dynamics is avoided. The time step of the time integration scheme does not have to deal with high-frequency dynamics since such dynamics are treated quasi-statically. A larger time step may be used for the dynamics calculation. For the low-frequency dynamics, smaller matrix problems result during time integration. Since the different contributions of the response are split up, solving each sub-problem corresponds to smaller matrix problems. The cost of manipulating matrices solutions is more than proportional with matrix size (i.e., two smaller matrices are cheaper than one larger matrix with the size of the two smaller ones). The processor may perform the simulation more rapidly.

In act 20, another possible element of the simulation is to neglect compliance of one or more objects (e.g., stiff objects). For modeling lightweight gear interaction with other objects that are more rigid, the compliance of the other objects may be ignored. The other object is treated as rigid, at least for use of the bulk compliance in the simulation. In the example of FIG. 1, the bulk compliance is used for only the lightweight gear 10 as the lightweight gear 10 is formed from flexible plastic. The bulk compliance is not used in the simulation for the solid gear 12 made of a relatively undeformable material, like steel. The bulk compliance of a housing, bearing, additional gears, or other objects may be neglected in the simulation.

In another element, the simulation is performed where the blank of the gear is not axisymmetric, or cannot reasonably be approximated to be axi-symmetric. FIG. 1 shows the blank of the solid gear 12 as symmetric. The blank of the lightweight gear is not axi-symmetric due to the cutouts or holes. The lack of axi-symmetry may be caused by any fixedly attached components, such as a ring gear connected to an outer housing. Other non-axisymmetric gear blanks include a linear gear (e.g., non-cylindrical structure with teeth), also referred to as a rack, or a gear that does not encompass a full circle (e.g., a weaving machine gear with a ¼ circle shaped body and teeth along the curved edge).

To model gears with non-axi-symmetric gear blanks, the gear design is meshed. The simulation uses the mesh that represents the shape of the gear, so accounts for the non-traditional shape.

In another element, the simulation is performed where a single component has several gear geometries. An example is a compound gear. For a compound gear, a single component has several gear geometries. If 2 or more gears are fixedly connected to a same shaft, this combination of components can be treated as a single component having several gear geometries If several gear geometries, such as internal gears, are fixedly connected to other components, such as other parts of a gearbox housing, this may be treated as a single component having several gear geometries. In one embodiment, the coupling between loading onto different gear geometries of a single component is accounted for.

To model asymmetric and/or non-traditional gears, the gear design is meshed. The simulation uses the mesh that represents the shape of the gear, so accounts for the non-traditional shape.

Act 22 of FIG. 2 shows another element that may be used in the simulation of the compliance. The processor calculates damping between interacting objects. The damping is calculated for each interacting component or just a limited number of interacting components, such as damping for one of two interacting gears. The damping is for gear-to-gear, gear-to-bearing, bearing-to-bearing, or other combination of components.

Various aspects of damping are included. The damping is decomposed into two or more aspects. The composite parts of damping are damping caused by energy dissipation due to deformation of the bulk of the component, by energy dissipation due to local contact deformation, energy dissipation from lubricant film behavior, and/or other aspect of damping. The processor calculates the damping, in part, by decomposing the damping, into two or more separately calculated aspects. Any calculation of damping may be used, such as modeling viscosity increase with pressure for fluid film modeling. In the simulation, a material or other characteristic is altered to include the damping aspect.

In one embodiment, the coupling between objects is modeled as a Hertzian contact (i.e., smooth surface with no lubricant). In other embodiments, the coupling accounts for a rough surface, lubricated, or both rough surface and lubricated contact. For example, Wiegert, et al. teach in "A Simplified elastohydrodynamic contact model capturing the nonlinear vibration behavoiur" accounting for the effects of fluid film. Both the material near the contact zone (equation 9) and the fluid film (equation 4) contribute to local contact compliance. The fluid film thickness causes an additional deflection of the contacting solids. There is also force transferred between the components, even though there is no solid-to-solid contact. For example, the fluid film damping is neglected by neglecting the second term in (equation 4). The underlying mathematical problem then becomes:

$$w_i = q_i + M\vec{F} + \delta(\vec{F}) = 0, \forall i$$

In this implementation, $\delta(\vec{F}) = \delta_{due\ to\ 2\ solids}(\vec{F}) - h_c(\vec{F})$, in which $\delta_{due\ to\ 2\ solids}(\vec{F})$ is the deflection due to the local contact compliance of both components, and $h_c(\vec{F})$ is the average fluid film thickness in the lubricated contact.

If the fluid film damping is not neglected, then the dynamics of the fluid film are accounted for. The average fluid film thickness at a given point depends on the thickness first time derivative, giving:

$$\delta(\vec{F}) = \delta_{due\ to\ 2\ solids}(\vec{F}) - h_c(\vec{F}, \dot{h}_c)$$

In this implementation, $h_c(\vec{F}, \dot{h}_c)$ now also depends on its time derivative $\dot{h}_c$.

To account for the combined effect of fluid film and surface roughness, equation 19 taught by Akbarzadeh, et al. in "Performance of Spur Gears Considering Surface Roughness and Shear Thinning Lubricant" is used, but other approaches may be used. Assuming that both the material near the contact zone and the fluid film contribute to local contact compliance, the formulation of the lubricant equations of Wiegert, et al. are used, but with the equation of Akbarzadeh, et al. This combination is then used in calculating the local contact compliance, but not the separate bulk compliance.

The simulation of the lubricant may account for the coupling between the responses of the lubricant in different discretized contact patches. The lubricant squeezed out of one discretized contact patch may be moved into another discretized contact patch. The modeling with the lubricant may account for this transfer. A resistance to such flow may occur due to mutual reaction between contact patches. The resistance is included in the simulation of the fluid response.

In act 24, the simulation accounts for the coupling of a gear with multiple other objects. For example, the gear includes a set of continuously connected teeth. The teeth are positioned so that the gear interacts with another object as the gear rotates. For example, FIG. 1 shows two gears 10, 11 each with a set of continuously connected teeth. This example provides for interaction of one object with another.

The simulation accounts for coupling with additional objects. Another portion of a gear than a first set of continuously connected teeth interacts or couples with a different object. For example, the gear contacts a bearing in an axial hole. As another example, a spring, cam, chain drive, or other drive connects to the gear. In yet another example, the gear includes different sets of continuously connected teeth, such as in a compound gear. The different sets of teeth couple with different gears. In yet another example, a sun gear of a planetary stage makes contact with several planet gears. As another example, a ring gear may contact the gearbox housing and/or a bearing structure as well as another gear.

To account for coupling with more than one other object, the simulation accounts for the other contacts in each contact. For example, the deflection due to bulk compliance at one discretized contact patch may be affected by the loading onto another discretized contact patch. Similarly, the deflection due to local contact compliance at one discretized contact patch may be affected by the loading onto another discretized contact patch. In case matrices are used to describe a compliance, matrices capturing compliance for each object from all contributing objects are generated as discussed above.

Additionally or alternatively, the simulation accounts for coupling of multiple or successive teeth as part of a same set of teeth in act 26. The teeth are part of a continuously connected set of teeth, such as teeth around a circumference of a circular gear. Continuous is used in the sense of the teeth of the set successively interacting with a same component as the gear or component rotates. When two gears contact, multiple surfaces contact, such as multiple teeth contacting at a same time. The simulation accounts for the coupling of successive teeth pairs by accounting for the coupling in the bulk compliance and/or coupling in the local contact compliance (e.g., coupling in compliance between discretized contact patches). The deflection due to local contact compliance at one discretized contact patch of a pair of teeth may be affected by the loading onto another discretized contact patch of an adjacent pair of teeth.

Additionally or alternatively, the simulation accounts for coupling of multiple discretized contact patches on a single tooth, bearing raceway, or bearing rolling element. When two components contact, the contact is spread out over an area, which may encompass multiple discretized contact patches. The simulation accounts for the coupling of multiple discretized contact patches on a single tooth, bearing raceway, or bearing rolling element by accounting for the coupling in the bulk compliance and/or coupling in the local contact compliance. The deflection due to local contact compliance at one discretized contact patch of a pair of teeth may be affected by the loading onto another discretized contact patch of an adjacent pair of teeth. Any modeling may be used to represent coupling in local contact compliance, such as disclosed by Teutsch, et al. in "Alternative Slicing Technique in non-Hertzian Line Contacts."

The successive teeth modeling is handled as part of the local contact compliance and the bulk compliance. Both of the separated components of compliance separately address the effects of successive teeth contact.

In one embodiment, the successive teeth pair coupling is accounted for using finite element analysis. The web thickness, web asymmetry, and/or holes in the web may affect the successive teeth pair coupling, so finite element analysis with the web or mesh of the blank is included in the successive teeth pair calculations.

In another element, the simulation may account for the edges of teeth. The teeth of a gear extend from one edge of the gear to another. The teeth have an outer surface for contact with teeth of another gear. This surface is continuous in a wave or other teeth pattern across multiple teeth. The teeth end at two edges of parallel planes, which are parallel to the plane in which the gear rotates. The deflection that occurs at an interior of the teeth away from the edges is different than that which occurs at the edges. In a zone near an edge of the gear and teeth, the local contact compliance will be larger since there is only material on one side to resist local contact deflection. On the surface of the tooth spaced from the edge, there is material on both sides of the tooth. The local contact compliance for a contact in the middle of the tooth contact surface is different. Also, due to the proximity of the edge, the lubricant film thickness may be lower near the edge, resulting in a difference in the local contact compliance at the edge as compared to other locations of the contact patch.

The simulation accounts for the difference due to the edge by an approach proposed by Reusner, H., 1977, "Druckflächenbelastung and Oberflächenverschiebung im Wälzkontakt von Rotationskörpern," Dissertation, University of Karlsruhe, Germany. Reusner extended the half-space theory to the case where the contacting bodies are both limited in the longitudinal direction. By mirroring the contact pressure about the end planes of the contacting bodies, shear stresses are cancelled out in these planes (i.e., stresses not present in a real contact). The contact area is sub-divided in strips along the contact line and applied an iterative technique to numerically solve the problem.

In act 30, the simulation is output. The processor outputs a value, an image, a video, a table, statistics, or other information derived from the simulation. For example, the stiffness as a function of radius of a lightweight gear is calculated in response to an applied excitation or force from a coupled gear. An instantaneous meshing stiffness as function of roll angle is output in another example. Gear meshing forces, transmission error, angular speed, or other values may be calculated. The output may be of a value or force in the frequency domain. For example, the Fourier transform of the transmission error for a period of time after transients are damped out is calculated and presented as a graph or chart.

The output may be system-level analysis of a transmission. A force is simulated being applied to a gear, which then interacts through a chain of couplings with other components. Characteristics of the interaction and/or the different components are determined. The frequency content of the excitation and the modal properties of the housing result in an acoustic radiation that will determine the noise vibration harshness (NVH) performance of the transmission. Any characteristic of NVH may be calculated.

Lightweight gears are more compliant and thus reduce system-level Eigen frequencies, and change the spectral content of the dynamic gear contact forces. Furthermore, if the gear blank is not axisymmetric, such as due to holes in the blank, modulation effects arise on the gear stiffness. This in turn causes sidebands in the frequency spectrum of the transmission error and the meshing forces. This increases the possibility of exciting more effectively the modes of the housing. Combined with the fact that human hearing typically perceives modulated signals to be more annoying as compared to tonal signals, this may severely affect NVH performance and more in particular sound quality. The simulation may be used to output information for assessing NVH for a transmission design.

The effect of gear blank geometry on gear pair stiffness is simulated by decomposing the compliance of a gear pair into bulk compliance and local contact compliance. Near the contact area, where finite element analysis is less suited due to strong gradients in the deformation pattern, an analytical solution is used to predict local contact compliance. The bulk compliance, which accounts for the deformation further away from the contact area, is extracted in a pre-processing run from automated finite element analyses. The finite element analysis copes with complex geometry resulting from design of the lightweight gear. This best-of both worlds approach automatically captures the load-dependency of the tooth pair stiffness, as the local contact compliance model intrinsically captures its load-dependency due to change in contact area as contact load changes. The bulk compliance is calculated as a function of position along the tooth blank and angular position. A multibody simulation tool (e.g., LMS Virtual.Lab Motion) then interpolates this data at run-time. The computationally efficient evaluation of dynamic gear interaction enables analyzing system-level dynamics of gear transmissions with lightweight gears, while accounting for other significant effects such as (dynamic) shaft and housing compliance, and non-linear connections such as bearings and couplings. Internal gears and asymmetric gears may be modeled. The effect of ring gear flexibility on planetary gear transmission dynamics may be assessed.

Gear geometry may be interpreted as the geometry of an object, which in combination with corresponding gear geometry of another object, respects the equation of meshing when both objects are in a relative motion for which the gear geometries of both objects was designed, or violates the equation of meshing only to a minor extent when both objects are in a relative motion for which the gear geometries of both objects was designed.

Figure 8:
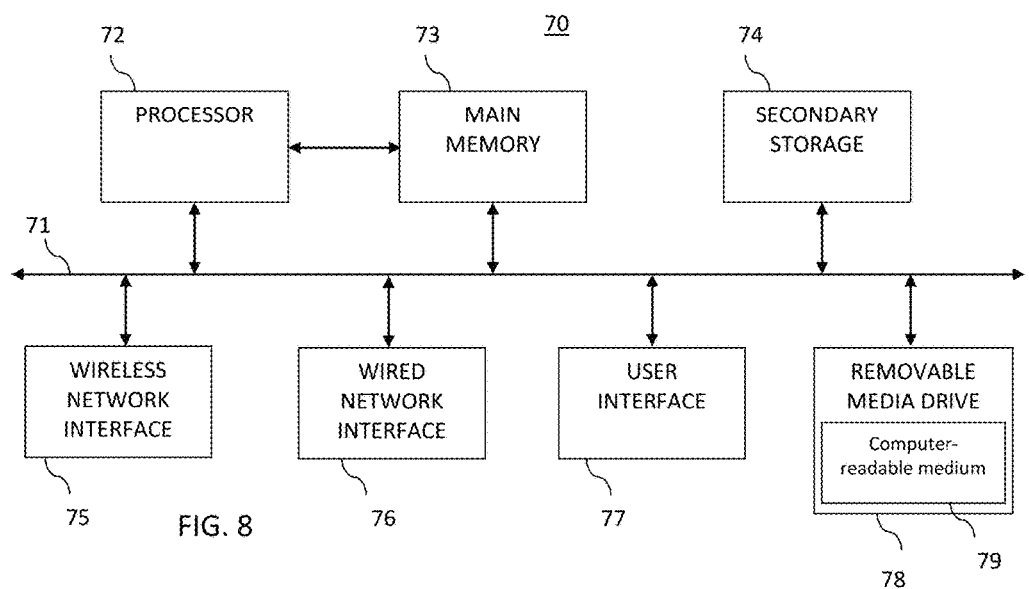
FIG. 8 is one embodiment of a system for gear contact modeling.

FIG. 8 shows one embodiment of a system for modeling gear contact. The system is shown as a simplified block diagram of an example apparatus 70. The system is a personal computer, lap top, tablet, workstation, mainframe, server, smart phone, or other computer device. The apparatus 70 includes software and/or hardware to perform any one or more of the activities or operations described herein.

The apparatus 70 includes a processor 72, a main memory 73, secondary storage 74, a wireless network interface 75, a wired network interface 76, a user interface 77, and a removable media drive 78 including a computer-readable medium 79. A bus 71, such as a system bus and a memory bus, may provide electronic communication between processor 72 and the other components, memory, drives, and interfaces of apparatus 70.

Additional, different, or fewer components may be provided. The components are intended for illustrative purposes and are not meant to imply architectural limitations of network devices. For example, the apparatus 70 may include another processor and/or not include the secondary storage 74 or removable media drive 78. As another example, the apparatus 70 connects with a camera and/or microphone. Each network device may include more or less components than other network devices.

Instructions embodying the activities or functions described herein may be stored on one or more external computer-readable media 79, in main memory 73, in the secondary storage 74, or in the cache memory of processor 72 of the apparatus 70. These memory elements of apparatus 70 are non-transitory computer-readable media. The logic for implementing the processes, methods and/or techniques discussed herein are provided on non-transitory computer-readable storage media or memories, such as a cache, buffer, RAM, removable media, hard drive or other computer readable storage media. Computer readable storage media include various types of volatile and nonvolatile storage media. Thus, 'computer-readable medium' is meant to include any non-transitory medium that is capable of storing instructions for execution by apparatus 70 that cause the machine to perform any one or more of the activities disclosed herein.

The instructions stored on the memory as logic may be executed by the processor 72. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like.

The memory (e.g., external computer-readable media 79, in main memory 73, in the secondary storage 74, or in the cache memory of processor 72) also stores pre-calculated information, numerical models, matrices, and data calculated during processing. For example, the memory stores pre-calculated deflection as a function of load location as a bulk compliance, and does this for several possible discretized contact patches, and possibly for several values of the load. The pre-calculated deflection is for parts of the gear spaced from a contact surface of the gear with another gear or object. The memory may alternatively or additionally store material, design, mesh (web), or other characteristics of the gear for simulating compliance. For example, the model of a flexible gear and the model of an inflexible gear are stored for use in simulation.

The wireless and wired network interfaces 75 and 76 may be provided to enable electronic communication between the apparatus 70 and other network devices via one or more networks. In one example, the wireless network interface 75 includes a wireless network interface controller (WNIC) with suitable transmitting and receiving components, such as transceivers, for wirelessly communicating within the network 10. In another example, the wireless network interface 75 is a cellular communications interface. The wired network interface 76 may enable the apparatus 70 to physically connect to a network by a wire, such as an Ethernet cable. Both wireless and wired network interfaces 75 and 76 may be configured to facilitate communications using suitable communication protocols, such as the Internet Protocol Suite (TCP/IP).

The processor 72, which may also be a central processing unit (CPU), is any general or special-purpose processor capable of executing machine readable instructions and performing operations on data as instructed by the machine readable instructions. The main memory 73 or other memory may be accessible to processor 72 for accessing machine instructions and may be in the form of random access memory (RAM) or any type of dynamic storage (e.g., dynamic random access memory (DRAM)). The secondary storage 74 may be any non-volatile memory, such as a hard disk, which is capable of storing electronic data including executable software files. Externally stored electronic data may be provided to computer 70 through one or more removable media drives 78, which may be configured to receive any type of external media 79, such as compact discs (CDs), digital video discs (DVDs), flash drives, external hard drives, or any other external media. The processor 72 is configured by the instructions and/or hardware.

In one embodiment, the processor 72 is configured to calculate deflection response of a lightweight gear to the load from another gear. This response uses pre-calculated deflection (e.g., bulk compliance) and an additional deflection at the contact surface (e.g., local contact compliance) as separate variables. The local contact compliance and/or bulk compliance are calculated as a quasi-static response to a change in the load. In another embodiment, the local contact compliance and/or residual bulk compliance are calculated as a quasi-static response to a change in the load. In yet another embodiment, the residual local contact compliance and/or residual bulk compliance are calculated as a quasi-static response to a change in the load. The processor 72 performs the simulation accounting for any of various elements.

A user interface 77 may be provided in none, some or all devices to allow a user to interact with the apparatus 70. The user interface 77 includes a display device (e.g., plasma display panel (PDP), a liquid crystal display (LCD), or a cathode ray tube (CRT)). In addition, any appropriate input device may also be included, such as a keyboard, a touch screen, a mouse, a trackball, microphone (e.g., input for audio), camera, buttons, and/or touch pad. In other embodiments, only the display (e.g., touch screen) is provided. The display portion of the user interface receives images, graphics, text, quantities, or other information from the processor 72 or memory. The output of the simulation is presented to the user. Based on the output, the user may optimize design of a gear without requiring manufacture of many different designs for testing.

Additional hardware may be coupled to the processor 72 of the apparatus 70. For example, memory management units (MMU), additional symmetric multiprocessing (SMP) elements, physical memory, peripheral component interconnect (PCI) bus and corresponding bridges, or small computer system interface (SCSI)/integrated drive electronics (IDE) elements. The apparatus 70 may include any additional suitable hardware, software, components, modules, interfaces, or objects that facilitate operation. This may be inclusive of appropriate algorithms and communication protocols that allow for the effective protection and communication of data. Furthermore, any suitable operating system is configured in apparatus 70 to appropriately manage the operation of the hardware components therein.

Due to the use of pre-calculation of the bulk compliance and due to quasi-static handling of at least some of the dynamics, the simulation may be performed more rapidly than using overall compliance simulated with finite element analysis. For example, the calculations for bulk compliance for two lightweight gears 10 of FIG. 1 and other preparatory functions (stages 1-7 of FIG. 6) take about 1.5 hours on a laptop computer. The central processor time for stage 8 depends on the overall size of the model. The simulation is a time domain simulation in which the contact of two pre-processed gears contacting takes about 20-60 seconds of processor time to simulate 1 second of gear interaction. The simulation includes acts 18-24. As a result, the overall process may occur in approximately two hours on a laptop. This process allows accurate calculation of noise, durability, and/or efficiency. Using finite element analysis without this approach may take hours or days to simulate gear contact over a same simulated time period on the same laptop.

Product manufacturers of mechanical drivelines benefit from improved processing speed in modeling gear contact. Virtual prototyping of gear box design enables predicting the performance (dynamics, noise, durability) and efficiency with the accuracy desired for industrial designs while keeping the CPU costs affordable. By handling lightweight and/or a variety of gear designs with or without lubrication, surface roughness, damping, successive gear contact, bearing contact, and/or other elements, a large variety of design options is provided in simulation. The products designed using the simulator likely have improved transmission performance (e.g., lower noise, larger durability) and increased efficiency (e.g., lower friction, larger energy yield) due to the refinements possible through virtual testing. Added value is provided for product manufacturers of mechanical drivelines in transportation (e.g., automotive or aeronautics), in machinery (e.g., mechanical industries), and in energy (e.g., wind turbines).

Providing meshing in a CAD-to-CAE approach, lubrication modeling, successive gear teeth coupling, contact with more than one other component (e.g., a gear contacting multiple other gears, bearings, and/or housing), and/or separate dynamic behavior of the gear body may benefit the simulation. When lubrication is part of the model, the properties may be input in the user interface of a software tool. The graphic user interface of the tool may have a setting whether to include the multiple gear contacts or only the main gear contact. Other settings for other elements may be provided. In a parametric model order reduction, non-linear finite elements model may be used.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method for modeling gear contact between a first gear and a second gear, the method comprising:
    calculating a matrix for a residual bulk compliance of a first gear, wherein the residual bulk compliance is a compliance from which a contribution of dynamically responding deformation patterns have been removed, the calculating being performed prior to a simulation of contact interaction of the first gear with a second gear; wherein the calculating is not repeated during the simulation;
    performing the simulation of the contact interaction of the first gear with the second gear, the simulation using the matrix for the residual bulk compliance and treating residual flexibility of the first gear quasi-statically;
    outputting the simulation; and
    forming the first gear based on the simulation.

2. The method of claim 1, wherein performing comprises accounting for a local contact compliance, which accounts for a deflection of the first gear near a contact, the local contact compliance not accounted for by the residual bulk compliance.

3. The method of claim 1, wherein the first gear comprises a gear geometry and all of the flexible response is approximated to respond quasi-statically, so that the residual bulk compliance represents all of a component's bulk compliance; and
    further comprising accounting for coupling between (a) the contact interaction of a first set of continuously connected teeth of the first gear with the second gear in the simulation, and, (b) the contact interaction of another portion of the first gear with a different object, the other portion being other than the first set of continuously connected teeth.

4. The method of claim 1, wherein calculating comprises calculating an amount of deflection of the first gear separated from a contact of the first gear with the second gear, the amount of the deflection being a function of an amount of applied load, and not repeating the calculating during the simulation.

5. The method of claim 1, wherein treating the flexibility of the first gear quasi-statically comprises treating deformation as if the instantaneously applied load is applied statically and all transient phenomena are damped out.

6. The method of claim 1, wherein the first gear comprises a gear geometry having one or more holes in a gear body other than an axial hole, and wherein calculating the matrix for the residual bulk compliance is a function of the one or more holes.

7. The method of claim 1, wherein performing the simulation comprises neglecting compliance of the second gear.

8. The method of claim 2, wherein accounting for the local contact compliance comprises accounting for coupling between the local contact compliance between different discretized patches of contact surface separate from the calculating of the matrix for the bulk compliance.

9. The method of claim 1, wherein using the matrix for the residual bulk compliance comprises computing the residual bulk compliance with analytical or closed-form solutions.

10. The method of claim 1, wherein the first gear comprises a gear geometry and performing the simulation comprises performing the simulation where the first gear comprises a non-axisymmetric structure supporting teeth of the gear geometry.

11. The method of claim 1, wherein the first gear comprises a gear geometry, bearing raceway geometry, geometry of a rolling element of a rolling element bearing, geometry of a hydrostatic bearing or geometry of a hydrodynamic bearing.

12. The method of claim 1, further comprising accounting for dynamic response of the flexibility with time integration for a first sub-set of Eigen modes of response of the first gear to an applied load, wherein treating comprises treating the flexibility quasi-statically for a second sub-set of the Eigen modes, the second sub-set different than the first sub-set.

13. The method of claim 1, further comprising accounting for dynamic response of the flexibility with time integration for a first sub-set of dynamics of the first gear's flexibility, wherein treating comprises treating the flexibility quasi-statically for a second sub-set of the dynamics of the first gear's flexibility, the second sub-set different than the first sub-set.

14. The method of claim 1, wherein performing the simulation comprises calculating damping between the first gear and the second gear, the damping decomposed for the calculating of the damping into two or more of: energy dissipation due to deformation of a bulk of the first gear, energy dissipation due to local contact deformation, and energy dissipation from lubricant.

15. The method of claim 1, wherein the first gear comprises a gear geometry with a set of continuously connected teeth, further comprising:
automatically generating a first mesh for the set of continuously connected teeth of the first gear from design parameters of a gear teeth geometry where the first mesh is structured to be identical for each tooth's surface; and
automatically generating a second mesh different than the first mesh for a blank or structure supporting teeth of the first gear from the computer assigned design of the first gear, the blank not including the set of continuously connected teeth of the first gear.

16. The method of claim 1, wherein the first gear comprises a bearing raceway geometry, further comprising:
automatically generating a first mesh of a part of the first gear identified as bearing raceway from design parameters of the bearing raceway where the first mesh is structured along a surface of the bearing raceway; and
automatically generating a second mesh different than the first mesh for a structure supporting the raceway of the first gear from the computer assigned design of the first gear, the structure not including the part of the first gear identified as the bearing raceway.

17. The method of claim 1, wherein calculating the matrix for the residual bulk compliance comprises accounting for coupling between interaction of the first gear with the second gear and interaction between the first gear and a different object.

18. The method of claim 2, wherein the local contact compliance accounts for coupling between different discretized contact zones.

19. The method of claim 2, in which the local contact compliance accounts for the change in local contact compliance due to a distance of non-contact edges.

20. The method of claim 2, wherein accounting for the local contact compliance is represented as Hertzian contact.

21. The method of claim 2, wherein accounting for the local contact compliance accounts for roughness of surfaces of the contact, for lubrication, or for both the roughness and the lubrication.

* * * * *